US012603131B2

(12) United States Patent
Chen et al.

(10) Patent No.: US 12,603,131 B2
(45) Date of Patent: Apr. 14, 2026

(54) GATE-CONTROLLED THYRISTOR AND CAM ARRAY

(71) Applicant: MACRONIX International Co., Ltd., Hsinchu (TW)

(72) Inventors: Wei-Chen Chen, Taoyuan City (TW); Hang-Ting Lue, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 84 days.

(21) Appl. No.: 18/636,277

(22) Filed: Apr. 16, 2024

(65) Prior Publication Data

US 2025/0322874 A1 Oct. 16, 2025

(51) Int. Cl.
G11C 15/04 (2006.01)

(52) U.S. Cl.
CPC .................................. G11C 15/046 (2013.01)

(58) Field of Classification Search
CPC ...................................................... G11C 15/046
See application file for complete search history.

(56) References Cited

U.S. PATENT DOCUMENTS

| | | | |
|---|---|---|---|
| 6,856,528 B1 | 2/2005 | Kim | |
| 6,944,038 B2 | 9/2005 | de Sandre | |
| 7,230,452 B2 | 6/2007 | Hoon et al. | |
| 2023/0368842 A1* | 11/2023 | Tseng | ................... G11C 15/046 |

FOREIGN PATENT DOCUMENTS

| | | |
|---|---|---|
| TW | 201120888 | 6/2011 |
| TW | I741691 | 10/2021 |
| TW | 202307850 | 2/2023 |

OTHER PUBLICATIONS

"Office Action of Taiwan Counterpart Application", issued on Jan. 20, 2024, p. 1-p. 3.

* cited by examiner

*Primary Examiner* — Alfredo Bermudez Lozada

(74) *Attorney, Agent, or Firm* — J.C. PATENTS

(57) ABSTRACT

A gate-controlled thyristor (GCT) and CAM memory are provided. The GCT includes first, second and third transistors, each having a control end, first and second ends. The control ends of the first and second transistors are connected to a search line. The control end of the second transistor is applied with a fixed bias voltage, and the second end of the second transistor is connected to the first end of the first transistor. The second end of the third transistor is connected to the first end of the second transistor, and the first end is connected to a match line. Based on the search line voltage, a search bit is determined to compare the data and the search bit to determine whether the search bit matches the data. This configuration may be applied to 3D NAND memory, having a high capacity and performance.

26 Claims, 13 Drawing Sheets

1

GATE-CONTROLLED THYRISTOR AND CAM ARRAY

BACKGROUND

Technical Field

The disclosure relates to a content-addressable memory (CAM), and particularly relates to a gate-controlled thyristor and a CAM array.

Description of Related Art

Content-addressable memories (CAMs) are a type of memories. A CAM is designed so that, when the user inputs data, a search may be conducted throughout the CAM to check the data are present. If such data are found, the CAM may return one or more found addresses where the data are stored.

In order to realize a single branch CAM by using a single transistor, such transistor needs to exhibit an ambipolar property. For example, as shown in FIG. 1, a tunnel FET (TFET) 12 with a symmetric source/drain junction design has been adopted for a conventional CAM 10 to facilitate the ambipolar property. The gate of the TFET 12 is connected to a search line SL, one of the source and the drain is connected to a match line ML, and the other of the source and the drain is grounded. In addition, the match line ML may apply a power voltage VDD through a driving circuit 14. In the TFET 12, when a very high or low voltage is applied to the gate, a current $I_{ML}$ may flow through the transistor, and the properties of different polarities (e.g., P-type or N-type) are exhibited. However, with such design, the intrinsic TFET performance may be degraded, and an asymmetric junction profile is generally preferred to achieve a steep sub-threshold slope as well as a high on-current. In addition, the transistor with the ambipolar property may come with a poor on/off current ratio, which is detrimental for the sensing margin of a CAM.

SUMMARY

Based on the above, an embodiment of the disclosure provides a gate-controlled thyristor. The gate-controlled thyristor is configured as a content-addressable memory cell. The gate-controlled thyristor includes: a first transistor, having a control end, a first end, and a second end, wherein the control end is connected to a search line, and the second end is connected to a ground potential; a second transistor, having a control end, a first end, and a second end, wherein the control end is connected to a fixed bias voltage, the second end is connected to the first end of the first transistor, and the second transistor is configured to store data; and a third transistor, having a control end, a first end, and a second end, wherein the control end is connected to the search line, the first end is connected to a match line, and the second end is connected to the first end of the second transistor. A search bit is determined based on a search line voltage applied to the search line, and the search bit and the data are compared to determine whether the search bit matches the data.

According to another embodiment, a content-addressable memory array of an NOR type is provided. The content-addressable memory array includes: match lines, disposed to be substantially parallel in a column direction; search lines, disposed to be substantially parallel in a row direction; and content-addressable memory cells, each including a gate-controlled thyristor, wherein the content-addressable memory cells is respectively disposed at intersections of the match lines and the search lines. Each of the gate-controlled thyristors includes: a first transistor, having a control end, a first end, and a second end, wherein the second end is connected to a ground potential; a second transistor, having a control end, a first end, and a second end, wherein the control end is connected to a fixed bias voltage, the second end is connected to the first end of the first transistor, and the second transistor is configured to store data; and a third transistor, having a control end, a first end, and a second end, wherein the second end is connected to the first end of the second transistor. The first end of the third transistor of each gate-controlled thyristor in a same row in the row direction, among the gate-controlled thyristors, is connected to a corresponding match line of the match lines. The control end of the first transistor and the control end of the third transistor of each gate-controlled thyristor in a same column of the column direction, among the gate-controlled thyristors, are connected to a corresponding search line of the search lines. For a selected gate-controlled thyristor among the gate-controlled thyristors, a search bit is determined based on a search line voltage applied to the corresponding search line, and the search bit and the data are compared to determine whether the search bit matches the data.

According to another embodiment, a content-addressable memory array of a NAND type is provided. The content-addressable memory array includes: match lines; search lines; and content-addressable memory cells, each including a gate-controlled thyristor, wherein the content-addressable memory cells are arranged to extend along a column direction and a row direction to form a memory array. The gate-controlled thyristor includes: a first transistor, having a control end, a first and a second end; a second transistor, having a control end, a first end, and a second end, wherein the control end is connected to a fixed bias voltage, the second end is connected to the first end of the first transistor, and the second transistor is configured to store data; and a third transistor, having a control end, a first end, and a second end, wherein the second end is connected to the first end of the second transistor. Gate-controlled thyristors in a same column in the row direction, among the gate-controlled thyristors, are connected with each other in series, the first end of the third transistor of a first gate-controlled thyristor among the gate-controlled thyristors in the same column is connected to a corresponding match line of the plurality of match lines, and the second end of the first transistor of a final gate-controlled thyristor among the gate-controlled thyristors in the same column is connected to the ground potential. The control end of the first transistor and the control end of the third transistor of each of gate-controlled thyristors in a same row in the column direction, among the gate-controlled thyristors, are connected to a corresponding search line of the plurality of search lines. For a selected gate-controlled thyristor among the gate-controlled thyristors, a search bit is determined based on a search line voltage applied to the corresponding search line, and the search bit and the data are compared to determine whether the search bit matches the data.

According to an embodiment of the disclosure, in the gate-controlled thyristor or the content-addressable memory array, in response to the search line voltage being higher than a predetermined voltage, the second transistor of the gate-controlled thyristor is in a first type operation state, and in response to the search line voltage being lower than the predetermined voltage, the second transistor of the gate-controlled thyristor is in a second type operation state.

According to an embodiment of the disclosure, in the gate-controlled thyristor or the content-addressable memory array, the first type operation state is an NFET state, and the second type operation state is a PFET state.

According to an embodiment of the disclosure, in the gate-controlled thyristor or the content-addressable memory array, the fixed bias voltage is set between a threshold voltage corresponding to a first data state under the second type operation state and a threshold voltage corresponding to a second data state under the first type operation state.

According to an embodiment of the disclosure, in the gate-controlled thyristor or the content-addressable memory array, in response to the search line voltage being higher than the predetermined voltage, the search bit is a first bit, and in response to the search line voltage being lower than the predetermined voltage, the search bit is a second bit.

According to an embodiment of the disclosure, in the gate-controlled thyristor or the content-addressable memory array, in response to the search bit matching the data, the second transistor generates an off-current; in response to the search bit mismatching the data, the second transistor generates an on-current, and a ratio of the on-current relative to the off-current is at least $10^6$.

According to an embodiment of the disclosure, in the gate-controlled thyristor or the content-addressable memory array, the predetermined voltage is 0V.

According to an embodiment of the disclosure, in the gate-controlled thyristor or the content-addressable memory array, the first type operation state is an N-type operation state, and the second type operation state is a P-type operation state.

According to an embodiment of the disclosure, in the gate-controlled thyristor or the content-addressable memory array, the second transistor is provided with a charge trapping layer between the control end serving as a gate and a channel. According to an embodiment of the disclosure, in the gate-controlled thyristor or the content-addressable memory array, the charge capturing layer includes an oxide-nitride-oxide layer.

Based on the above, the gate-controlled thyristor according to the embodiments of the disclosure may serve as a TCAM cell, with which a NAND type or an NOR type CAM memory array can be formed. In addition, with the operation of the gate-controlled thyristor according to the embodiments of the disclosure, a high on/off current ratio is attained. Therefore, the sensing margin for reading is increased, and the accuracy in determining "match" or "mismatch" for data search is facilitated.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 2:
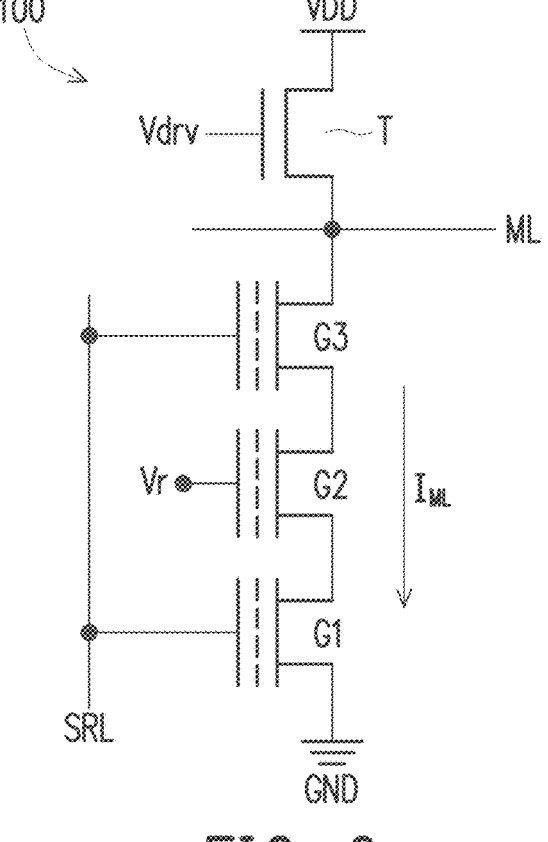
FIG. 2 illustrates a circuit structure of a gate-controlled thyristor according to an embodiment of the disclosure.

FIG. 2 illustrates a circuit structure of a gate-controlled thyristor according to an embodiment of the disclosure. As shown in FIG. 2, a gate-controlled thyristor (GCT) 100 is adopted to realize a content-addressable memory (CAM) cell in the embodiment. The gate-controlled thyristor 100 includes a first transistor G1, a second transistor G2, and a third transistor G3. Each of the first to third transistors G1 to G3 has a control end, a first end, and a second end. In an embodiment, in a case that the first transistor G1, the second transistor G2, and the third transistor G3 are realized by using MOS or FET transistors, the gate may serve as a control end configured to control on or off of each transistor, and the source and the drain may serve as the first end and the second end. The first transistor G1, the second transistor G2, and the third transistor G3 are connected with each other in series. Accordingly, the second transistor G2 is configured to store data, and the first transistor G1 and the third transistor G3 are configured as pass gates.

As shown in FIG. 2, the first transistor G1 has the control end, the first end, and the second end. The control end is connected to a search line SRL, and the second end is connected to a ground potential GND. The second transistor G2 has the control end, the first end, and the second end. The control end is connected to a fixed bias voltage Vr, and the second end is connected to the first end of the first transistor G1. The third transistor G3 has the control end, the first end, and the second end. The control end is connected to the search line SRL. The first end is connected to a match line ML, and the second end is connected to the first end of the second transistor G2.

As shown in FIG. 2, a driving circuit T is configured to drive the match line ML. The driving circuit T may include various circuit components. For the ease of description, the case where one transistor serves as a switch element is described. When the second transistor G2 is selected to be read, a driving voltage Vdrv is applied to the driving circuit T to turn on the driving circuit T. Then, the power voltage VDD may be applied to the match line to provide the match line ML with a high voltage. During the operation of the gate-controlled thyristor 100, the match line ML may be maintained at the power voltage VDD. During the operation of the gate-controlled thyristor 100, if a search result "mismatch" is occurred, the match line ML may discharge power to the ground potential GND through the third transistor G3, the second transistor G2, and the third transistor G3, i.e., a match line current $I_{ML}$ is generated. At this time, the voltage of the match line ML may change, such as starting to drop from the power voltage VDD.

According to an embodiment of the disclosure, the second transistor G2 may be provided with a charge trapping layer between the gate and the channel. The charge trapping layer may exhibit a composite layered configuration of an oxide-nitride-oxide (ONO) layer and be configured to store data. Any material or parameter in the conventional transistor technique may be adopted for the materials and physical parameters (e.g., thickness, etc.) of the ONO layer. The disclosure is not particularly limited in the disclosure. A data value may be determined in accordance with whether electrons are injected into the ONO layer of the second transistor G2. For example, a state without electron injection into the ONO layer is referred to as data "0", and a state where a large amount of electrons are injected into the ONO layer is referred to as data "1". The threshold voltage of the second transistor G2 may be determined according to whether electrons are injected. As another example, the state of the data, i.e., data "0" and data "1", may also be determined according to the relative amount of injected electrons. For example, data "1" may indicate that a relatively large amount of electrons are injected into the ONO layer, and data "0" may indicate that a relatively small amount of electrons are injected into the ONO layer. Still, the difference in the amount of injected electrons is sufficient to clearly distinguish between data "0" and data "1". Besides, in addition to determining the state of the data according to whether electrons are injected, the state of the data may also be determined according to whether holes are injected.

During the operation of the gate-controlled thyristor 100, data "0" or data "1" stored in the second transistor G2 is read by applying the fixed bias voltage Vr to the control end (gate) of the second transistor G2. Meanwhile, a search line voltage $V_{SRL}$ is applied to the search line SRL. The search line voltage $V_{SRL}$ being lower than a predetermined voltage (e.g., 0V) indicates a search bit "0", and the search line voltage $V_{SRL}$ being higher than the predetermined voltage (e.g., 0V) indicates a search bit "1". The search bit indicates that a search is being conducted in the data bit stored in the second transistor G2 of the gate-controlled thyristor 100 (CAM cell).

At this time, by comparing the search bit and the data that is read, if the search bit and the data match, the second transistor G2 is not turned on, and the power voltage VDD applied to the match line ML is not discharged to the ground potential GND through the respective transistors G1, G2, G3. At this time, the match line current $I_{ML}$ is equivalent to an off-current (Ioff), indicating no current flows through. Alternatively, if the search bit and the data do not match ("mismatch"), the second transistor G2 is turned on, and the power voltage VDD applied to the match line ML is discharged to the ground potential GND through the respective transistors G1, G2, G3. At this time, the match line current $I_{ML}$ is equivalent to an on-current Ion, indicating a current flows through. Therefore, based on the amplitude of the sensed current, the address of the data being searched may be found.

In addition, according to an embodiment of the disclosure, when the search line voltage $V_{SRL}$ is higher than the predetermined voltage (e.g., 0V), the second transistor G2 of the gate-controlled thyristor 100 is in a first type operation state and behaves like an NFET transistor (i.e., an NFET state). Alternatively, when the search line voltage $V_{SRL}$ is lower than the predetermined voltage (e.g., 0V), the second transistor G2 of the gate-controlled thyristor 100 is in a second type operation state and behaves like a PFET transistor (i.e., a PFET state).

In addition, in such configuration, the end (the first end of the third transistor G3) connected to the match line ML is a P+ junction region and may be further connected to a bit line. Also, the end bonded to the ground potential GND is an N+ junction region and may be further connected to a source line. That is, the physical behaviors of the gate-controlled thyristor 100 are equivalent to a component having a PN junction.

Figure 3A:
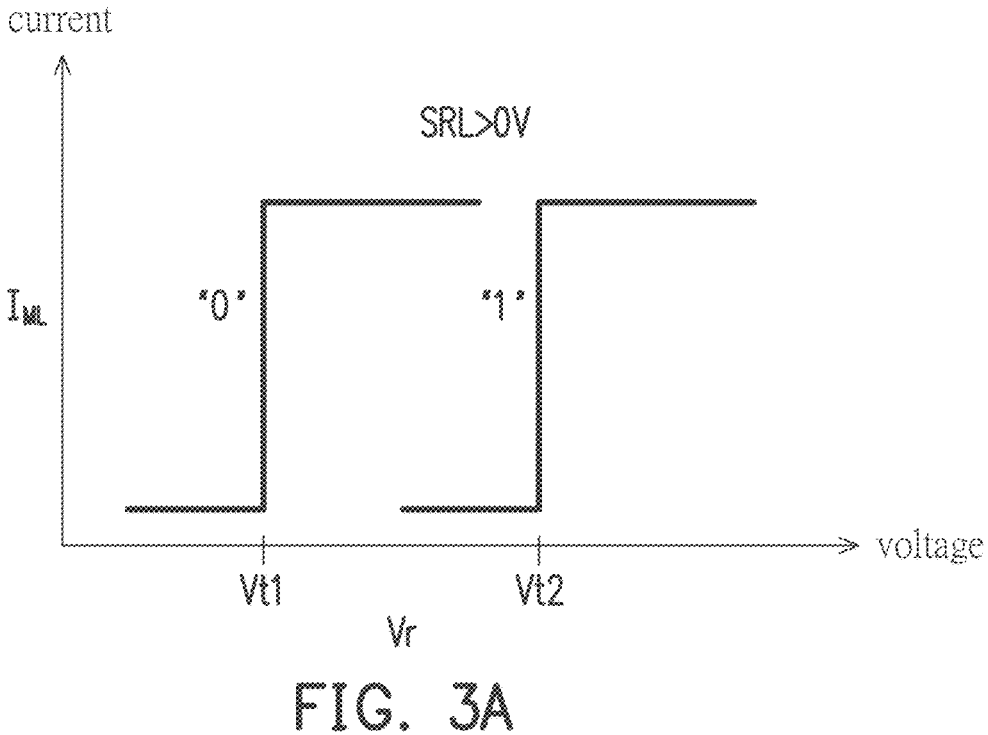
FIGS. 3A and 3B are schematic diagrams illustrating operations of the gate-controlled thyristor according to an embodiment of the disclosure.

As shown in FIG. 3A, the second transistor G2 corresponds to different threshold voltages Vt1, Vt2, etc., when the second transistor G2 is programmed to data "0" or data "1". With the search line voltage $V_{SRL}$ applied to the search line SRL being higher than 0V, for data "0", after the fixed bias voltage Vr exceeds the threshold voltage Vt1, the match line current $I_{ML}$ increases as the fixed bias voltage Vr increases. Similarly, for data "1", after the fixed bias voltage Vr exceeds the threshold voltage Vt2, the match line current $I_{ML}$ increases as the fixed bias voltage Vr increases. Therefore, when the search line voltage $V_{SRL}$ applied to the search line SRL is higher than 0V, the gate-controlled thyristor 100 (or may be considered as the transistor G2) may behave like an NFET transistor.

Figure 3B:
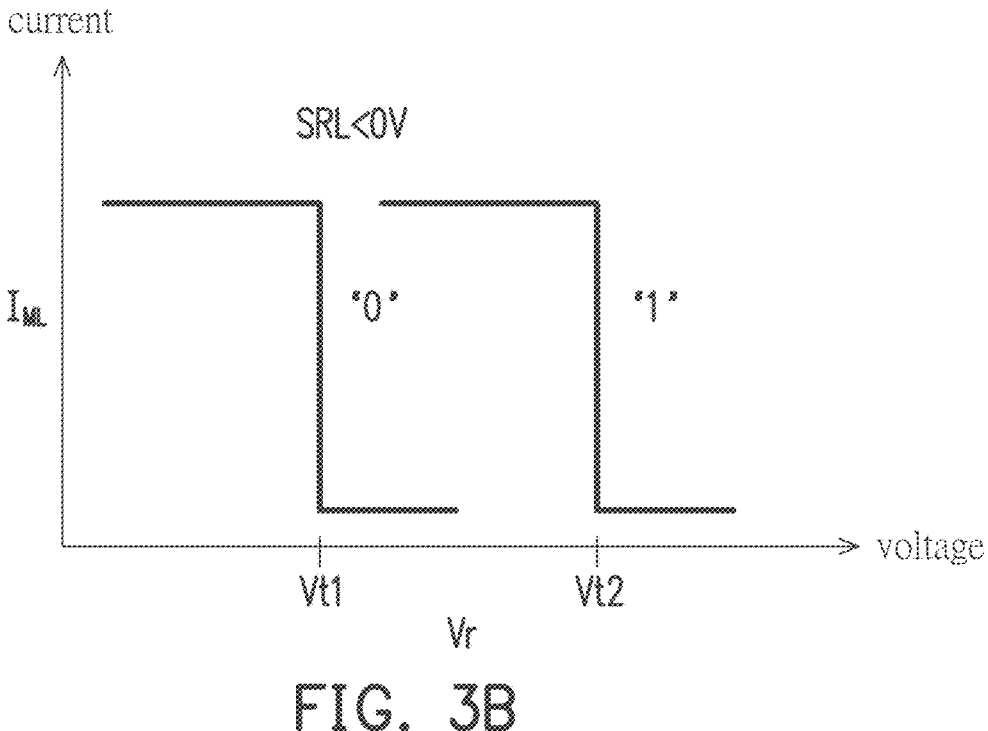

Meanwhile, as shown in FIG. 3B, the second transistor G2 corresponds to different threshold voltages Vt1, Vt2, etc., when the second transistor G2 is programmed to data "0" or data "1". With the search line voltage $V_{SRL}$ applied to the search line being lower than 0V, for data "0", after the fixed bias voltage Vr drops below the threshold voltage Vt1, the match line current $I_{ML}$ increases as the fixed bias voltage Vr decreases. Similarly, for data "1", after the fixed bias voltage Vr drops below the threshold voltage Vt2, the match line current $I_{ML}$ increases as the fixed bias voltage Vr decreases. Therefore, when the search line voltage $V_{SRL}$ applied to the search line SRL is lower than 0V, the gate-controlled thyristor 100 (or may be considered as the transistor G2) may behave like a PFET transistor.

Figure 4:
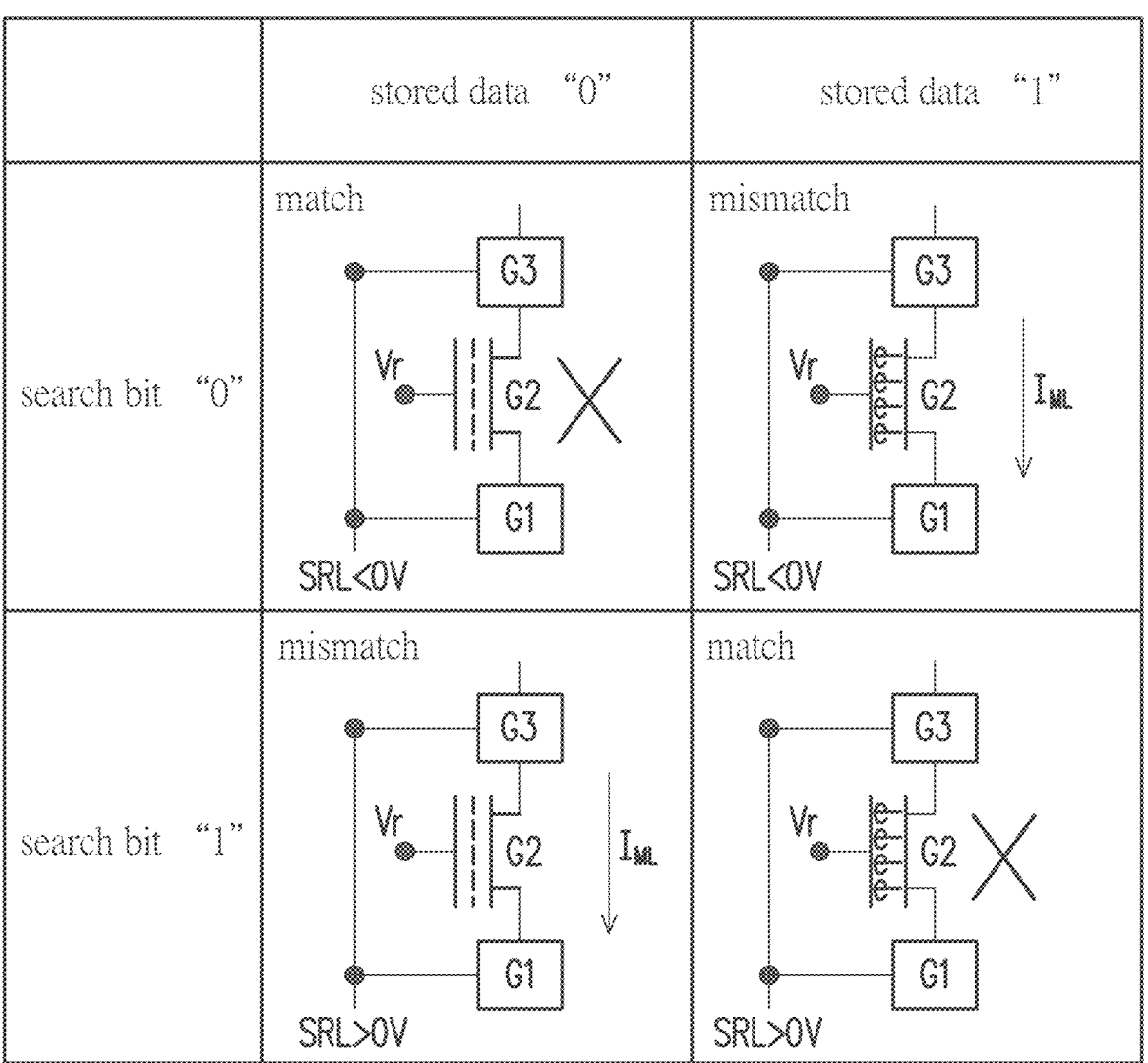
FIG. 4 is a schematic diagram of a truth table of the gate-controlled thyristor according to an embodiment of the disclosure.

FIG. 4 is a schematic diagram of a truth table of the gate-controlled thyristor according to an embodiment of the disclosure. As shown in FIG. 4, the lateral direction indicates the states where the second transistor G2 is stored with data "0" or data "1". As described above, in an example, the state of data "0" indicates that no charges are stored in the ONO layer of the second transistor G2, and the state of data "1" indicates that charges are stored in the ONO layer of the second transistor G2. In addition, the vertical direction indicates whether the search bit is "0" or "1". It is defined here that a search bit "0" indicates that the voltage $V_{SRL}$ is lower than 0V, and a search bit "1" indicates that the voltage $V_{SRL}$ is higher than 0V.

As shown in FIG. 4, when the search bit is "0" and the second transistor G is in the state of data "0", or when the search bit is "1" and the second transistor G2 is in the state of data "1", the gate-controlled thyristor 100 may output a result "match". At this time, the gate-controlled thyristor 100 does not generate the match line current $I_{ML}$ (i.e., Ioff). When the search bit is "0" and the second transistor G is in the state of data "1", or when the search bit is "1" and the second transistor G2 is in the state of data "0", the gate-controlled thyristor 100 may output a result "mismatch". At this time, the gate-controlled thyristor 100 (or the transistor G2) generates the match line current $I_{ML}$ (i.e., Ion).

In other words, the search bit being "0" indicates that data "0" is to be searched, and if the data stored in the second transistor G2 is also "0", then the data is found. At this time, no match line current $I_{ML}$ is generated, and the state is a state "match". The search bit being "1" indicates that data "1" is to be searched, and if the data stored in the second transistor G2 is "0", then the data is not found. At this time, the match line current $I_{ML}$ is generated, and the state is a state "mismatch". The search conducted when the search bit is "1" may also be inferred based on the truth table shown in FIG. 4.

According to FIG. 4, the gate-controlled thyristor 100 according to an embodiment of the disclosure may serve to realize a ternary CAM cell configuration of a single transistor (i.e., the second transistor G2).

Figure 5A:
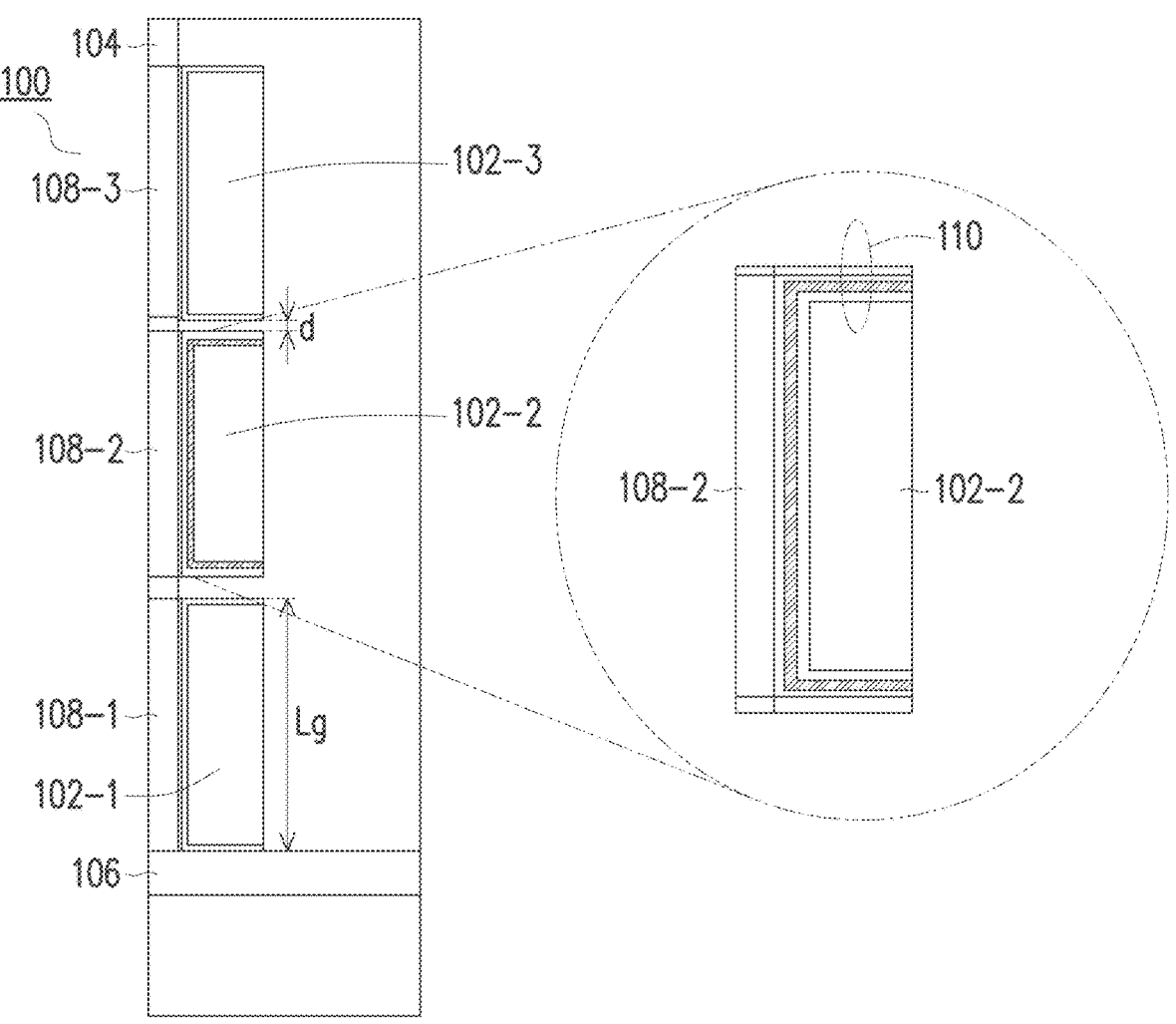
FIGS. 5A to 5C are diagrams illustrating experimental results of the gate-controlled thyristor according to an embodiment of the disclosure.
Figure 5B:
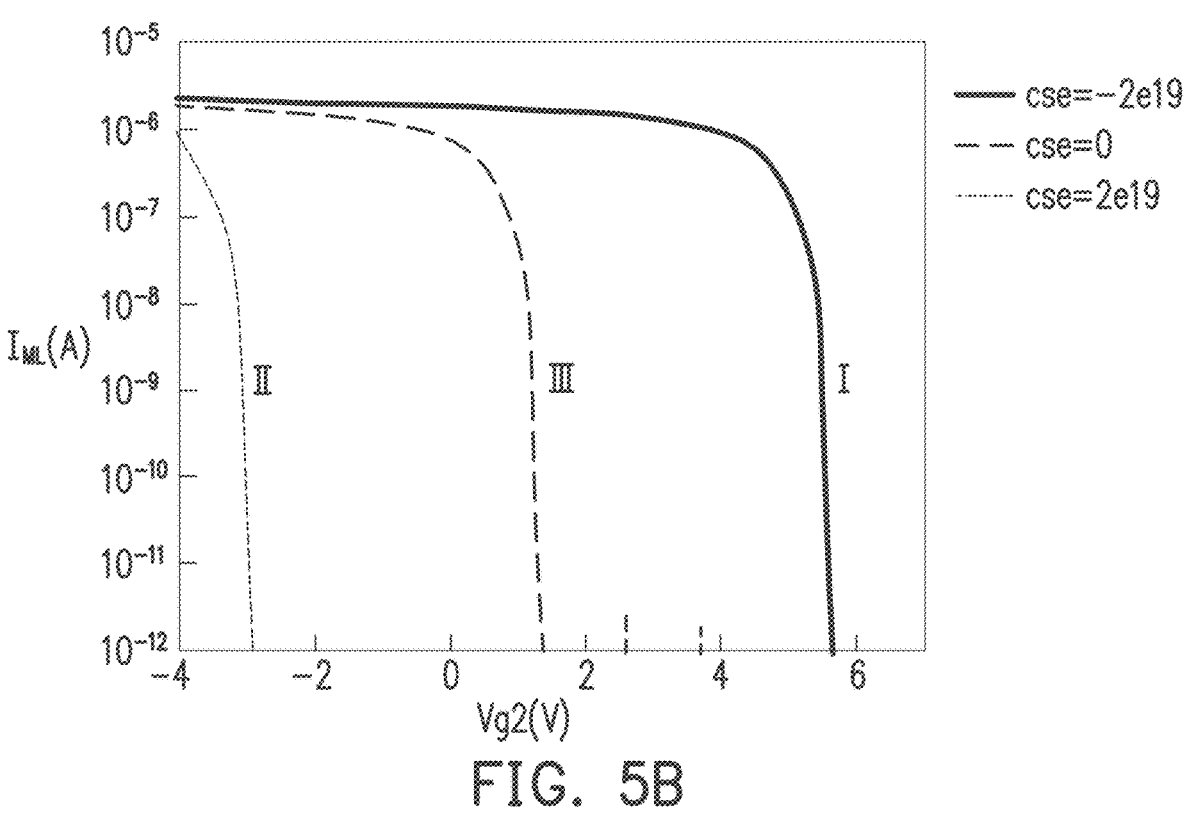
Figure 5C:
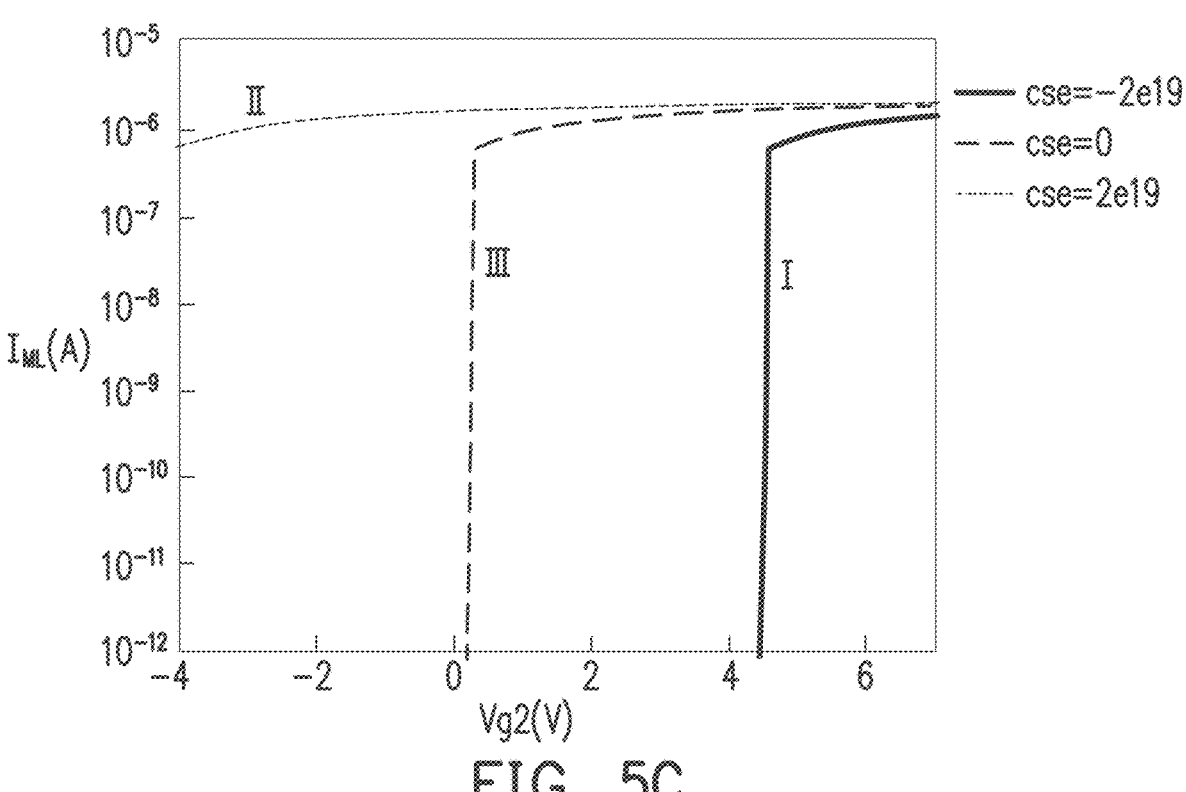

FIGS. 5A to 5C are diagrams illustrating experimental results of the gate-controlled thyristor according to an embodiment of the disclosure. FIG. 5A illustrates a schematic view illustrating a configuration of the gate-controlled thyristor 100 for which the experiment is conducted. FIG. 5B is a current-voltage curve diagram illustrating the behavior of the gate-controlled thyristor 100 as a PFET, and FIG. 5C is a current-voltage curve diagram illustrating the behavior of the gate-controlled thyristor 100 as an NFET.

As shown in FIG. 5A and FIG. 3, the gate-controlled thyristor 100 has gates 102-1, 102-2, 102-3 of the first transistor G1, the second transistor G2, and the third transistor G3, respectively. The gates 102-1, 102-3 may be further connected with the search line SRL, and the gate 102-2 may be further connected with a line providing the fixed bias voltage Vr (equivalent to a word line in a memory array, a multi-word lines configuration for a single cell). Below the gates 102-1, 102-2, 102-3 are respective channels 108-1, 108-2, 108-3 of the first transistor G1, the second transistor G2, and the third transistor G3. The first end of the third transistor G3 connected to the match line ML (equivalent to a bit line in a memory array) is a P+ doped region 104, and the second end of the first transistor G1 connected to the ground potential is an N+ doped region 106. Accordingly, the gate-controlled thyristor 100 is equivalent to a PN-junction component. In addition, the second transistor G2 serving to store data further includes an ONO layer 110 between the gate 102-2 and the channel 108-2, so as to capture charges (electrons or holes), i.e., to store data.

With the experiments performed, FIGS. 5B and 5C illustrate current-voltage (I-V) measurement results. As shown in FIG. 5B, the search line voltage $V_{SRL}$ applied to the search line SRL is-3V, lower than 0V. As described above, the second transistor G2 behaves like a PFET transistor. Curves I, II, III in FIG. 5B represent different cse states, where cse represents the number of charges stored in the ONO layer of the second transistor G2. Specifically, the curve I indicates that electrons are stored (cse=−2e19, i.e., negatively charged), the curve II indicates that holes are stored (cse=+2e19, i.e., positively charged), and the curve III indicates no charges are stored (cse=0, i.e., not charged). Also, as shown in FIG. 5C, the search line voltage $V_{SRL}$ applied to the search line SRL is +3V, higher than 0V. As described above, the second transistor G2 behaves like an NFET transistor. Similarly, in FIG. 5C, the curve I indicates that electrons are stored (cse=−2e19, i.e., negatively charged), the curve II indicates that holes are stored (cse=+2e19, i.e., positively charged), and the curve III indicates no charges are stored (cse=0, i.e., not charged).

According to FIGS. 5B and 5C, the second transistor G2 exhibits a rightward shift in the I-V curve as the charges increase in both the PFET and NFET states. Operations for conventional flash memories may be performed for the injection of charges. For example, programming may be performed by an F-N tunneling effect, a hot electron channel effect, etc. The disclosure is not particularly limited in this regard. In this manner, the data stored in the second transistor G2 may be changed by adjusting the threshold voltage Vt of the second transistor G2.

In addition, as shown in FIGS. 5B and 5C, by changing the polarity (positive or negative) of the search line $V_{SRL}$ of the search line SRL, the operation state of the second transistor G2 may be changed. That is, the second transistor G2 is switchable between the PFET state and the NFET state. That is, the polarity of gate voltages Vg1, Vg3 of the first transistor G1 and the third transistor G3 as pass gates, i.e., the polarity of the voltage $V_{SRL}$, determines the movement of the I-V curve. That is, as described above, the gate voltages Vg1, Vg3 of positive polarity ($V_{SRL}>0V$) in the pass gates result in the property of an NFET transistor, whereas the gate voltages Vg1, Vg3 of negative polarity ($V_{SRL}<0V$) in the pass gates result in the property of a PFET transistor.

In addition, as also shown in FIGS. 5B and 5C, the I-V curve of the gate-controlled thyristor 100 according to the embodiment exhibits a steep sub-threshold slope in both the PFET state and the NFET state, and the ratio between the on-current Ion and the off-current Ioff is very high. In the example of FIGS. 5B and 5C, in both of the PFET state and the NFET state, the on-current Ion is generally about 1e-6, and the off-current is Ioff is generally 1e-12 or lower. Therefore, the ratio of Ion/Ioff is at least 1e6.

Figure 6:
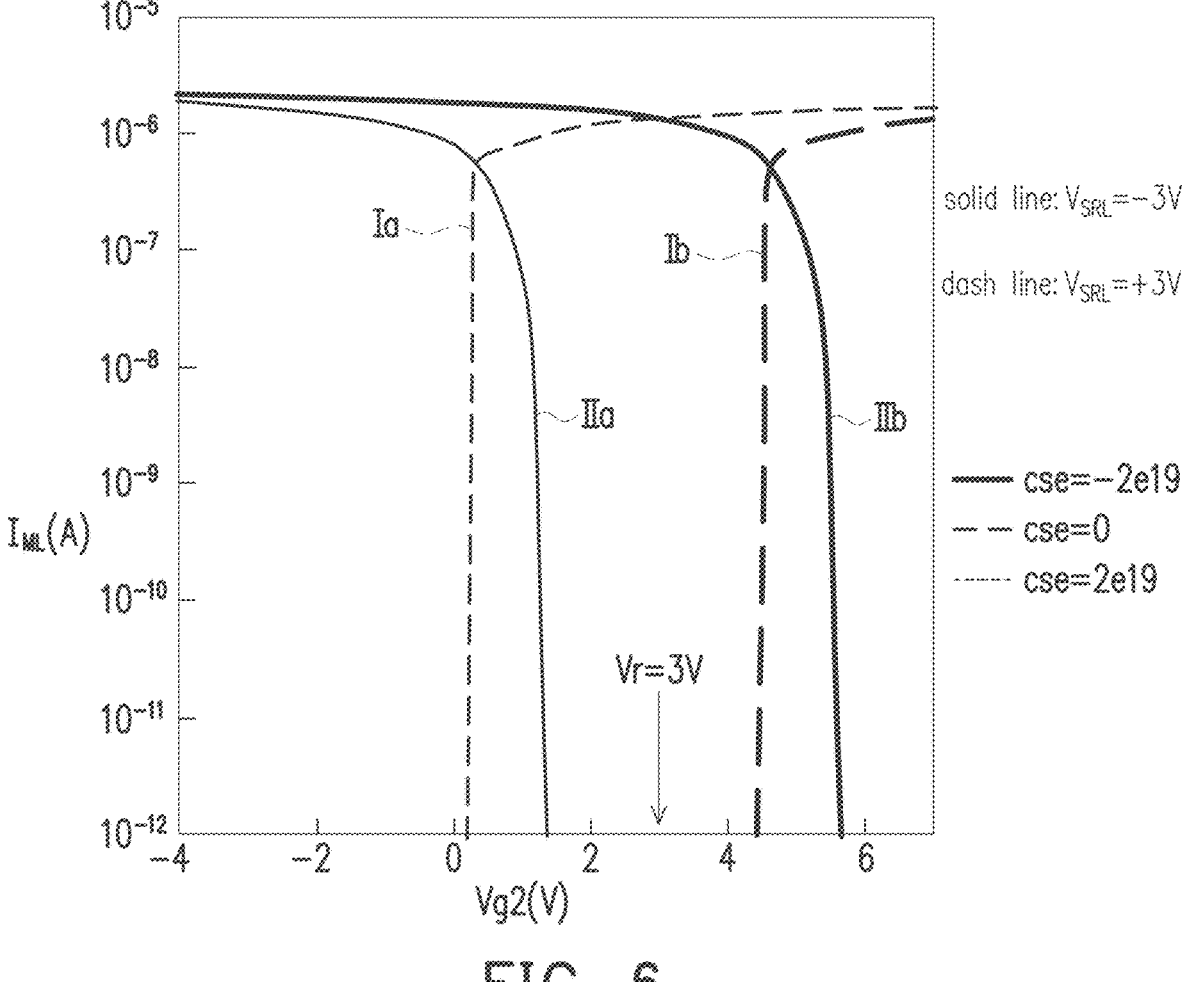
FIGS. 6 to 7 are schematic diagrams illustrating simulated searches in the CAM of the gate-controlled thyristor according to an embodiment of the invention.
Figure 7:
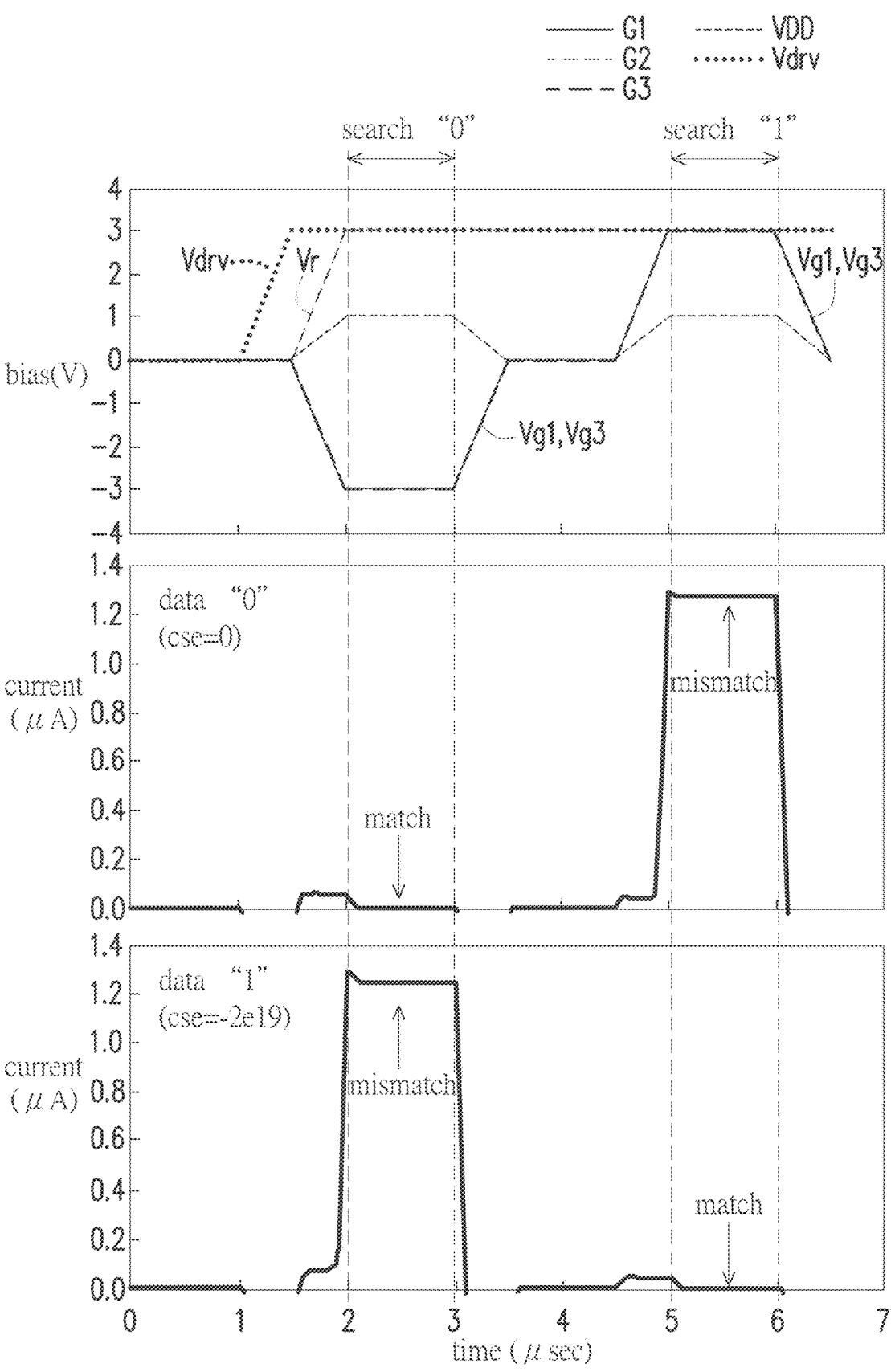

FIGS. 6 to 7 are schematic diagrams illustrating simulated searches in the CAM of the gate-controlled thyristor according to an embodiment of the invention. FIG. 6 is an exemplary I-V diagram, where the horizontal axis indicates the voltage Vg2 applied to the gate of the second transistor G2, i.e., the fixed bias voltage Vr. The experimental simulation diagram basically combines the schematic diagrams of FIGS. 3A and 3B in one I-V diagram.

In FIG. 6, the dash line indicates that the search line voltage $V_{SRL}$ is +3V, and the second transistor G2 behaves like an NFET. An I-V curve Ia indicates a first data state (e.g., data "0"), and an I-V curve Ib indicates a second data state (i.e., data "1"). In addition, the solid line indicates that the search line voltage $V_{SRL}$ is-3V, and the second transistor G2 behaves like a PFET. An I-V curve IIa indicates the first data state (e.g., data "0"), and an I-V curve IIb indicates the second data state (i.e., data "1"). In the case of the upper left part of the truth table of FIG. 4, the data is "1" and the search bit is "0", matching the I-V curve IIB of FIG. 6. Therefore, when the fixed bias voltage Vr=3V is applied to the gate of the second transistor G2, as shown in FIG. 6, the corresponding match line current $I_{ML}$ is about $10^{-6}$A, i.e., greater than 0. Therefore, it is accurately determined that the search result is "mismatch".

Thus, in order to obtain a correct matching result, the fixed bias voltage Vr needs to be set correctly. Therefore, the fixed bias voltage Vr may be set between the threshold voltage Vt1 corresponding to data "O" in the PFET state and the threshold voltage Vt2 corresponding to data "1" in the NFET state. That is, Vt1<Vr<Vt2.

Regarding the setting, the fixed bias voltage Vr may be set between the threshold voltage (i.e., the voltage value corresponding to Ioff in the I-V curve IIa) corresponding to the first data state (data "0") in the second type operation state (PFET state)) and the threshold voltage (i.e., the voltage value corresponding to Ioff in the I-V curve Ib) corresponding to the second data state (data "1") in the first type operation state (NFET state).

In addition, in FIG. 6, the first data state, i.e., data "0", uses cse=0, and the second data state, i.e., data "1", uses cse=−2e19. However, in general, the first data state and the second data state may be set with different charge amounts (electrons or holes). In addition, by adjusting the charge amounts, the threshold voltages Vt1, Vt2 may be shifted leftward/rightward, and the fixed bias voltage Vr may be adjusted accordingly.

As shown in FIG. 7, the uppermost voltage-time diagram illustrates the voltages Vg1, Vr, Vg3 applied to the respective gates of the first transistor G1, the second transistor G2, and the third transistor G3 in the gate-controlled thyristor 100 and a diagram illustrating changes over time in the power voltage VDD and the driving voltage Vdrv of the driving circuit. After the operation of the gate-controlled thyristor 100 starts, the driving voltage Vdrv of the driving circuit T increases from 0V to about 3V to apply the power voltage VDD to the match line ML. Then, the fixed bias voltage Vr starts to be applied to the gate of the second transistor G2 to read the data stored in the second transistor G2. At this time, the gate voltages Vg1, Vg3 (i.e., the search line voltage $V_{SRL}$) applied to the gates of the first transistor G1 and the third transistor G3 are −3V (lower than 0V). In other words, the search line SRL indicates the search bit of "0". Then, the gate voltages Vg1, Vg3 (i.e., the search line voltage $V_{SRL}$) applied to the gates of the first transistor G1 and the third transistor G3 is +3V (higher than 0V). In other words, the search line SRL indicates the search bit of "1".

At this time, as indicated in the current-voltage diagram in the middle part of FIG. 7, the data is "0" (assuming cse=0). At this time, when the search bit is "0", the state is "match". Therefore, the match line current $I_{ML}$ is about 0 μA (i.e., Ioff). Besides, when the search bit is "1", the state is "mismatch". Therefore, the match line current $I_{ML}$ is about 1.2 μA (i.e., Ion).

Moreover, as indicated in the current-voltage diagram in the lower part of FIG. 7, the data is "1" (assuming cse=−2e19). At this time, when the search bit is "0", the state is "mismatch". Therefore, the match line current $I_{ML}$ is about 1.2 μA (i.e., Ion). Besides, when the search bit is "1", the state is a state "match". Therefore, the match line current $I_{ML}$ is about 0 μA (i.e., Ioff).

According to the simulation result, the gate-controlled thyristor 100 provided in the embodiment is able to effectively determine whether the search data matches. Besides, the ratio between the on-current and the off-current (Ion/off) indicating mismatch and match is large, thereby offering a high sensing margin.

Figure 8:
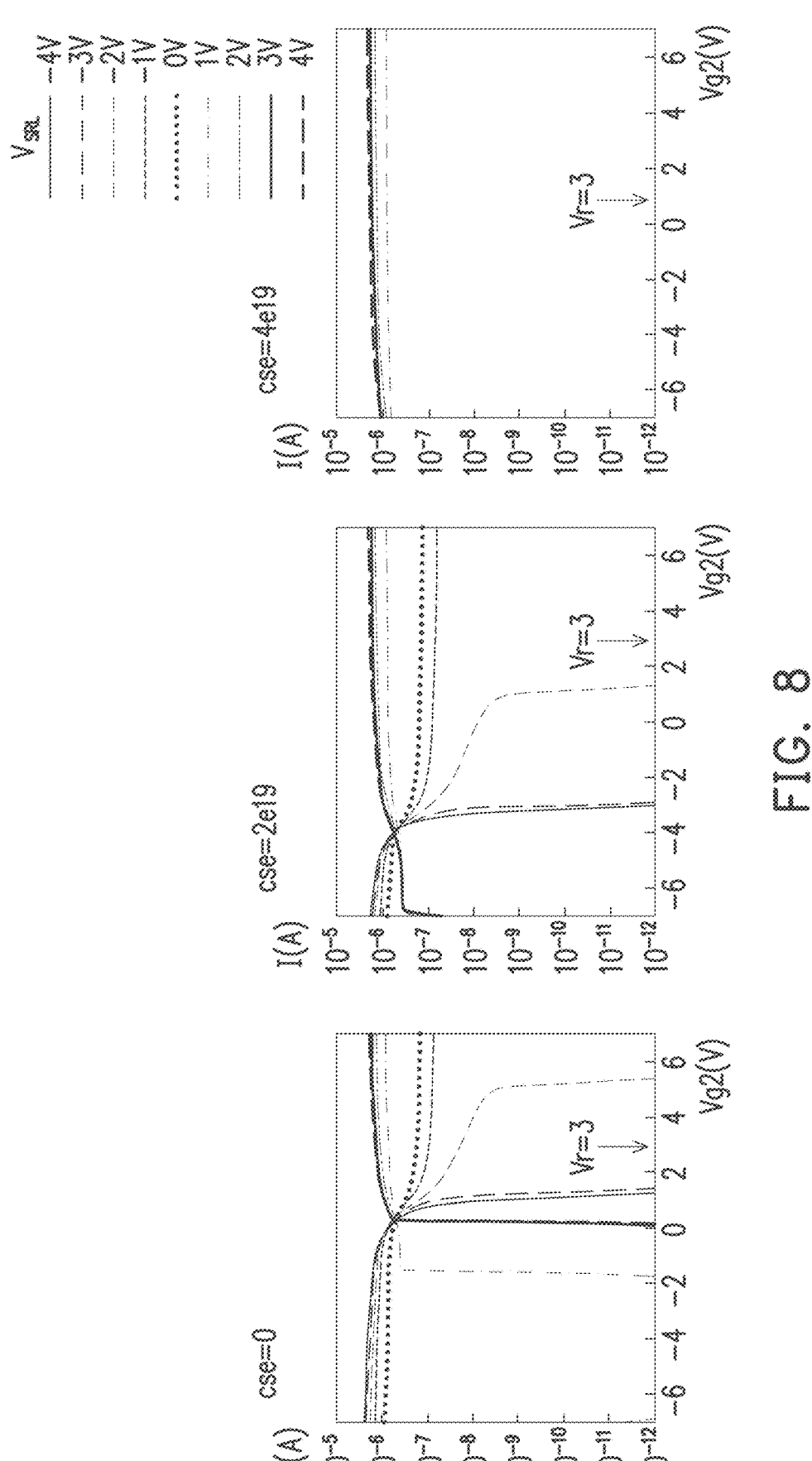
FIG. 8 is a schematic diagram illustrating an application of the gate-controlled thyristor according to an embodiment of the disclosure to an analog CAM.

FIG. 8 is a schematic diagram illustrating an application of the gate-controlled thyristor according to an embodiment of the disclosure to an analog CAM. FIG. 8 illustrates I-V diagrams of three different data states, where the diagram on the right indicates cse=0 (not charged), the diagram in the middle indicates cse=2e19 (positively charged), and the diagram on the left indicates cse=4e19 (even more positively charged). Here, holes are adopted as an example. The fixed bias voltage Vr is set at 3V. In FIG. 8, the respective I-V diagrams indicate various states of the search line voltage $V_{SRL}$=−4V to +4V.

In Table 1, the lateral direction indicates the match line current $I_{ML}$ and various data states when the fixed bias voltage Vr=3V, and the vertical direction indicates different search line voltages $V_{SRL}$. Table 1 shows that the margin between "match" and "mismatch" is adjustable. For example, when cse=0, "match" may be found in two search line voltages $V_{SRL}$ (−4V, −3V). When cse=2e19, "match" may be found in three search line voltages $V_{SRL}$ (−4V, −3V, −2V). When cse=4e19, "match" may be found in five search line voltages $V_{SRL}$ (−4V, −3V, −2V, −1V, 0V). Therefore, the margin between "match" and "mismatch" may be achieved by adjusting cse. Hence, the range of "match" (low match line current $I_{ML}$) may be adjusted within a continuous range. Therefore, different charge amounts may be programmed to the second transistor G2 based on needs to render an effect of an analog CAM.

TABLE 1

| | $I_{ML}$ @ Vr = 3 V cse = 0 | $I_{ML}$ @ Vr = 3 V cse = 2e19 | $I_{ML}$ @ Vr = 3 V cse = 4e19 |
|---|---|---|---|
| $V_{SRL}$ = −4 V | low (match) | low (match) | low (match) |
| $V_{SRL}$ = −3 V | low (match) | low (match) | low (match) |
| $V_{SRL}$ = −2 V | high (mismatch) | low (match) | low (match) |
| $V_{SRL}$ = −1 V | high (mismatch) | high (mismatch) | low (match) |
| $V_{SRL}$ = 0 V | high (mismatch) | high (mismatch) | low (match) |
| $V_{SRL}$ = 1 V | high (mismatch) | high (mismatch) | high (mismatch) |
| $V_{SRL}$ = 2 V | high (mismatch) | high (mismatch) | high (mismatch) |
| $V_{SRL}$ = 3 V | high (mismatch) | high (mismatch) | high (mismatch) |
| $V_{SRL}$ = 4 V | high (mismatch) | high (mismatch) | high (mismatch) |

Figure 9A:
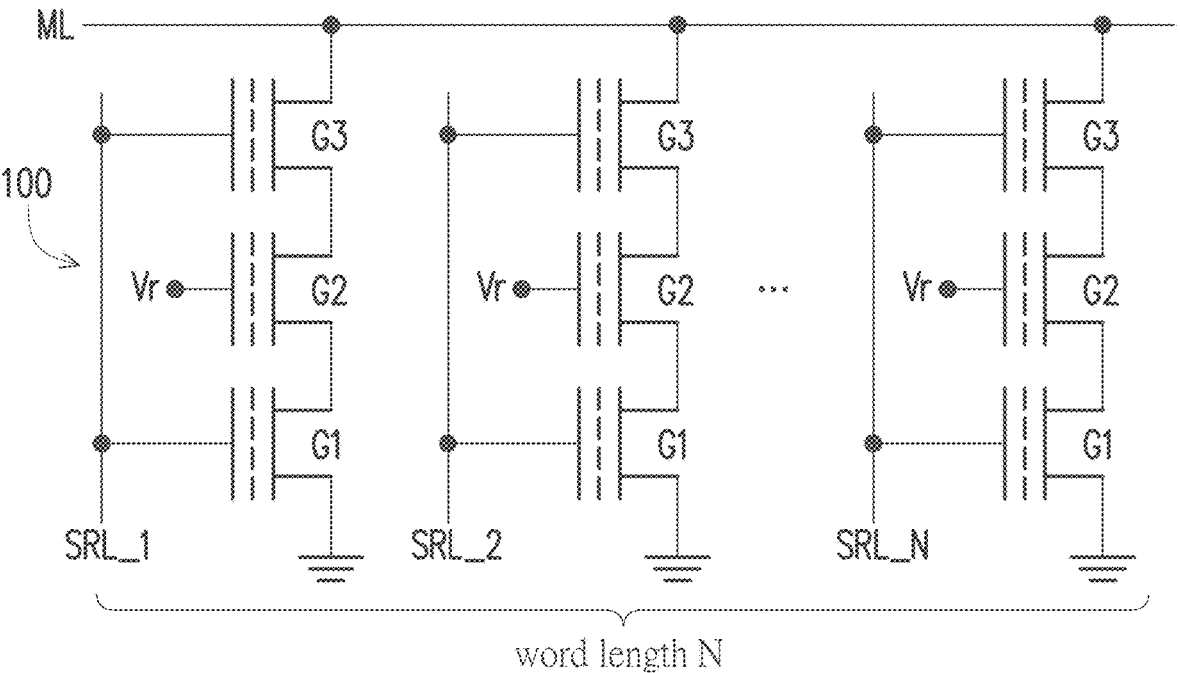
FIGS. 9A to 9C are schematic view illustrating a sensing margin of the gate-controlled thyristor according to an embodiment of the disclosure.
Figures 9B, 9C:
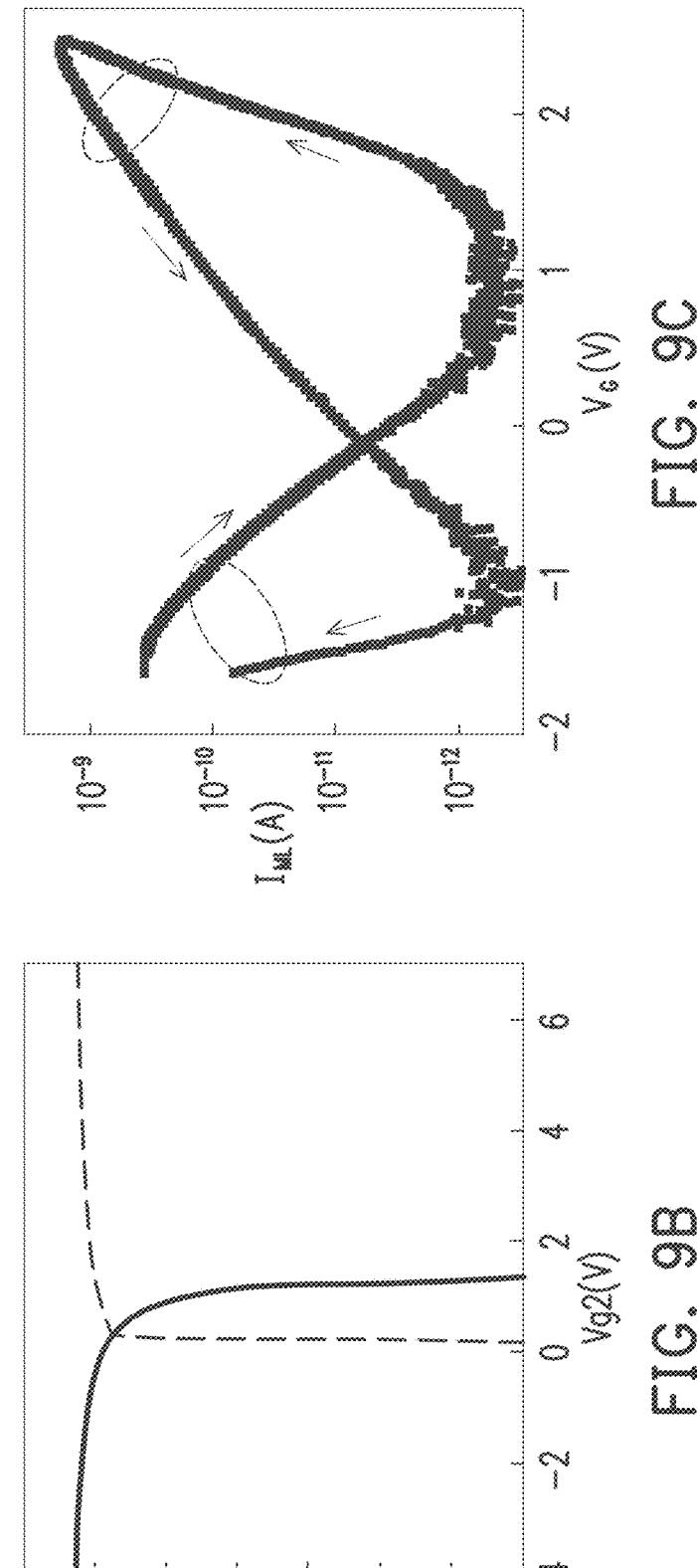

FIGS. 9A to 9C are schematic view illustrating a sensing margin of the gate-controlled thyristor according to an embodiment of the disclosure. During operation, it is in general to find out the address of a word. FIG. 9A illustrates the configuration of a word in a CAM. The example includes a CAM formed by N gate-controlled thyristors (GCTs) 100 shown in FIG. 2. In other words, the word length is N. Here, the match lines ML of the N gate-controlled thyristors 100 are connected together, and search lines SRL_1, SRL_2 to SRL_N of the respective gate-controlled thyristors 100 are provided separately.

According to the above, during the operation of the CAM, no current flows through the gate-controlled thyristor 100 at the time of "match", and a current flows through at the time of "mismatch". In general, it is desired that the difference between the currents of "match" and "mismatch" be as large as possible, so that whether the second transistor G2 in the gate-controlled thyristor 100 stores data may be determined easily. Therefore, a parameter of sensing margin (SM) is defined to represent how good/poor the sensing margin of a CAM is. The definition of the sensing margin SM is shown in the formula (1) below as a ratio between the case of "mismatch" by one bit (worst case) and the case of "match" in all bits. In the formula (1) below, the denominator indicates the case where all the bits are matched (the match line current $I_{ML}$=Ioff). The numerator indicates the case of being determined as "mismatch" while being closest to the current of "match", i.e., the case where only one bit is determined as "mismatch" while the rest (N−1) bits are determined as "match". Accordingly, the sensing margin SM is calculated. According to the formula, the greater the sensing margin SM the better.

$$SM = \frac{(N-1) \times Ioff + Ion}{N \times Ioff} = 1 - \frac{1}{N} + \frac{Ion}{N \times Ioff} \quad (1)$$

Figure 1:
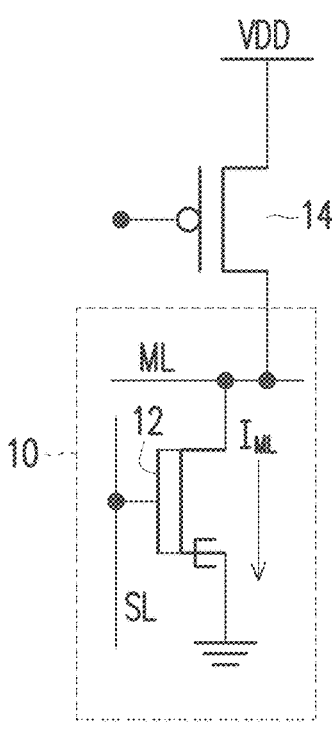
FIG. 1 is a schematic view illustrating a conventional single-branch content-addressable memory (CAM) including a transistor having an ambipolar property.

FIG. 9B illustrates an I-V curve of the gate-controlled thyristor 100 according to an embodiment of the disclosure. As described above, the solid line indicates the search bit "0" (i.e., $V_{SRL}<0V$), and the dash line indicates the search bit "1" (i.e., $V_{SRL}>0V$). FIG. 9C illustrates an I-V curve diagram of the CAM including the ambipolar TFET as shown in FIG. 1. In addition, Table 2 lists the sensing margins SM calculated for FIGS. 9B and 9C according to the above (both calculated assuming the word length N=1024).

TABLE 2

| Sensing Margin Benchmark for Single-branch CAM | | | | |
|---|---|---|---|---|
| Device | Word length (N) | Ion (A) | Ioff (A) | SM |
| GCT | 1024 | 1.2e−6 | 1e−13 | 11700 |
| Ambipolar TFET | 1024 | 1e−9 | 1e−13 | 11 |

According to Table 2, the sensing margin SM of the CAM including the gate-controlled thyristor 100 of the embodiment (FIG. 2) is 11700, whereas the sensing margin SM of the conventional CAM including the ambipolar TFET (FIG. 1) is 11. The gate-controlled thyristor 100 according to an embodiment of the disclosure provides a Ion/Ioff ratio higher than the conventional Ion/Ioff ratio by over 1000 times. Therefore, the CAM including the gate-controlled thyristor 100 according to an embodiment of the disclosure has a favorable sensing margin SM.

Figure 10:
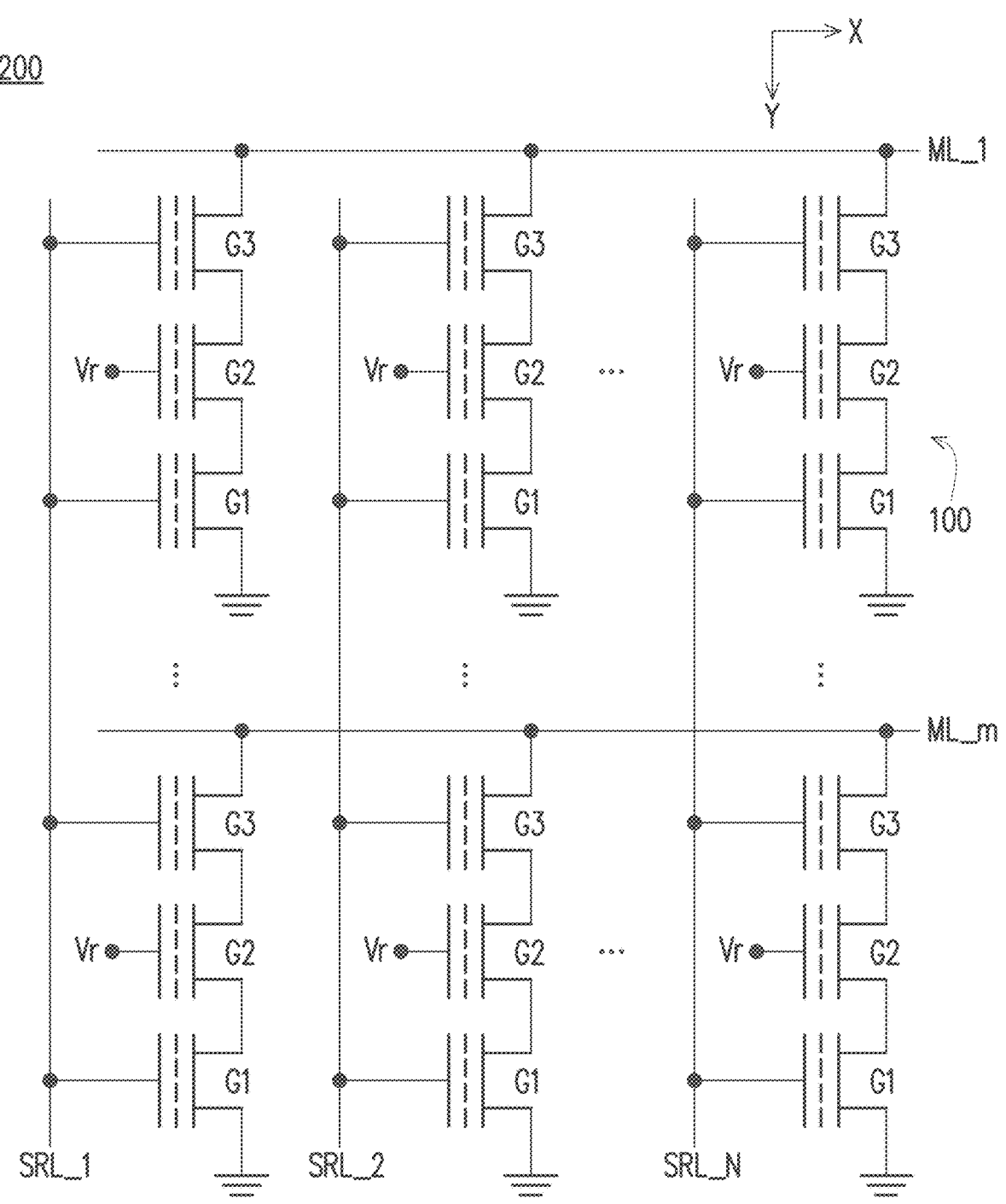
FIG. 10 is schematic view illustrating an NOR-type CAM array including the gate-controlled thyristor according to an embodiment of the disclosure.

FIG. 10 is schematic view illustrating an NOR-type CAM array including the gate-controlled thyristor according to an embodiment of the disclosure. As shown in FIG. 10, multiple gate-controlled thyristors 100 as CAM cells form a CAM array 200 of the NOR type. The CAM array 200 includes multiple CAM cells. Each of the CAM cells includes the gate-controlled thyristor 100 as shown in FIG. 2, and reference is made to the above description for the detailed configuration and operation thereof. The CAM array 200 further includes multiple match lines ML_1 to ML_m (m match lines) and multiple search lines SRL_1 to SRL_N (N search lines). The match lines ML_1 to ML_m are arranged substantially in parallel in a first direction (column direction, X direction). The search lines SRL_1 to SRL_N are arranged substantially in parallel in a second direction (row direction, Y direction).

In addition, the gate-controlled thyristors 100 are respectively disposed at intersections of the match lines ML_1 to ML_m and the search lines SRL_1 to SRL_N. The first ends of the third transistors of respective gate-controlled thyristors 100 in the same row, among the gate-controlled thyristors 100, are connected to the corresponding match line. For example, the first ends of the third transistors of the respective gate-controlled thyristors 100 of the first row are connected to the corresponding 1st match line ML_1, and the first ends of the third transistors of the respective gate-controlled thyristors 100 of the $m^{th}$ row are connected to the corresponding $m^{th}$ match line ML_m.

Besides, the gates of the first transistor G1 and the third transistor G3 of respective gate-controlled thyristors 100 in the same column, among the gate-controlled thyristors 100, are connected to the corresponding search line. For example, the gates of the first transistors G1 and the third transistors G3 of the respective gate-controlled thyristors 100 in the first row are connected to the corresponding $1^{st}$ search line SRL_1, and the gates of the first transistors G1 and the third transistors G3 of the respective gate-controlled thyristors 100 in the $N^{th}$ row are connected to the corresponding $N^{th}$ search line SRL_N. In addition, the second end of the first transistor G1 of each of the gate-controlled thyristors 100 is connected to the ground potential. Accordingly, the NOR-type TCAM array 200 is formed by using the gate-controlled thyristors 100.

Reference is made to the description relating to FIG. 4 for the truth table adopted by the gate-controlled thyristor 100 as each CAM cell. Accordingly, a data search may be conducted in the CAM array 200 to determine whether the search data match the data stored in the CAM array 200.

Figure 11:
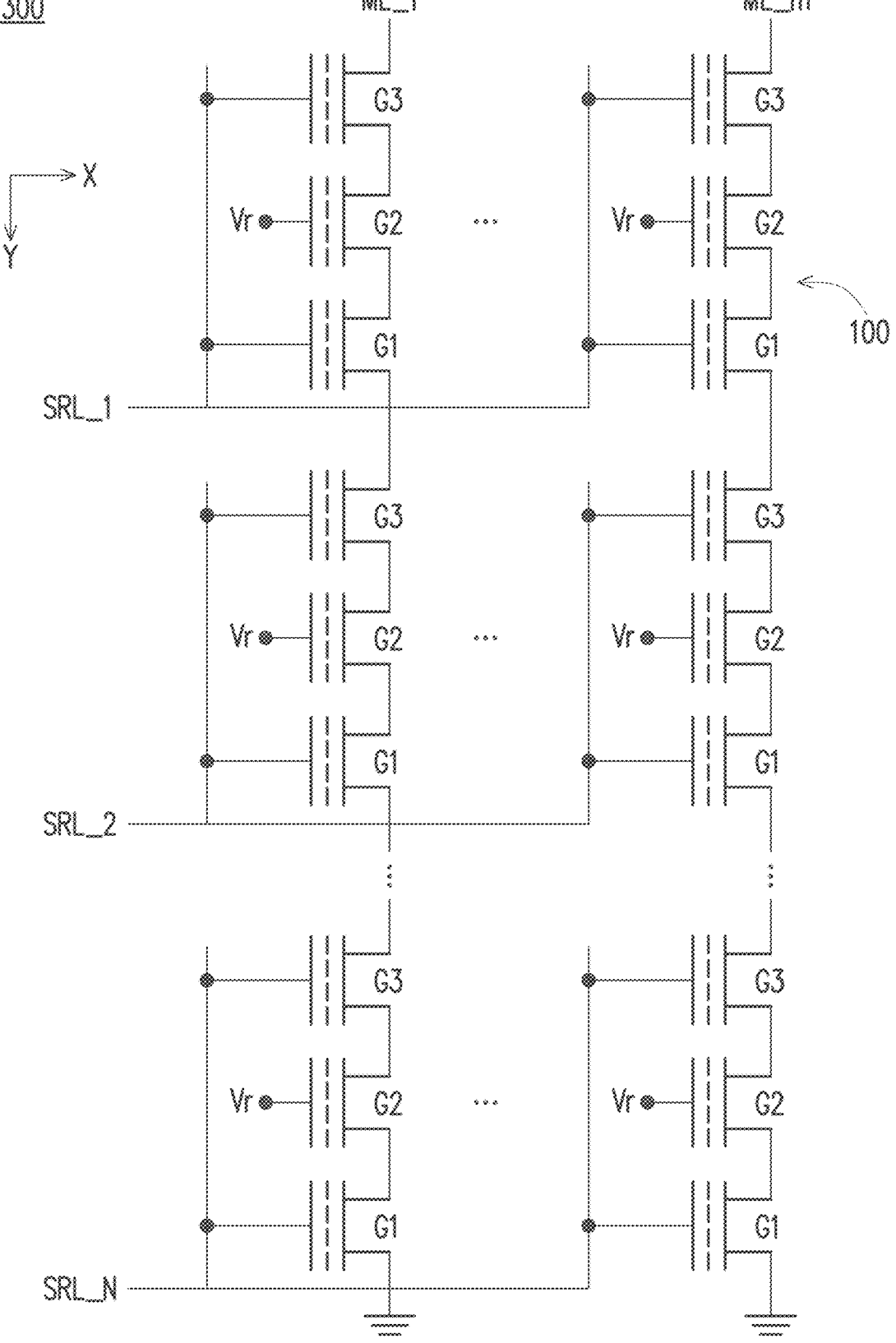
FIG. 11 is schematic view illustrating a NAND-type CAM array including the gate-controlled thyristor according to an embodiment of the disclosure.

FIG. 11 is schematic view illustrating a NAND-type CAM array including the gate-controlled thyristor according to an embodiment of the disclosure. As shown in FIG. 11, multiple gate-controlled thyristors 100 as CAM cells form a CAM array of the NAND type. The CAM memory array 300 further includes multiple match lines ML_1 to ML_m (m match lines) and multiple search lines SRL_1 to SRL_N (N search lines).

The respective content-addressable memory cells, i.e., the gate-controlled thyristors, are arranged to extend along the column direction (X direction) and the row direction (Y direction) to form a memory array. The gate-controlled thyristors 100 in the same column (i.e., the first to $m^{th}$ columns) in the row direction Y are connected with each other in series. The first end of the third transistor G3 of the first gate-controlled thyristor among the gate-controlled thyristors in the same column is connected to the corresponding match line among multiple match lines, and the second end of the first transistor G1 of the final gate-controlled thyristor 100 among the gate-controlled thyristors in the same column is connected to the ground potential. For example, the first end of the third transistor G3 of the first gate-controlled thyristor 100 (i.e., m=1, N=1) among the gate-controlled thyristor of the first column is connected to the corresponding match line ML_1 among multiple match lines, and the second end of the first transistor G1 of the final gate-controlled thyristor 100 (i.e., m=1, N=N) among the gate-controlled thyristors of the same column is connected to the ground potential.

In addition, the control ends of the first transistor G1 and the third transistor G3 of each of the gate-controlled thyristors 100 in the same row (e.g., the $1^{st}$ row to the $N^{th}$ row) in the column direction (X direction) are connected to the corresponding search line among the search lines. For example, the control ends of the first transistor G1 and the third transistor G3 of each of the gate-controlled thyristors 100 if the first row (i.e., (1, 1) to (m, 1) are connected to the corresponding search line SRL_1 among the search lines. The same configuration applies to the remaining rows. Accordingly, the NAND-type TCAM array 300 is formed by using the gate-controlled thyristors 100.

Figure 12:
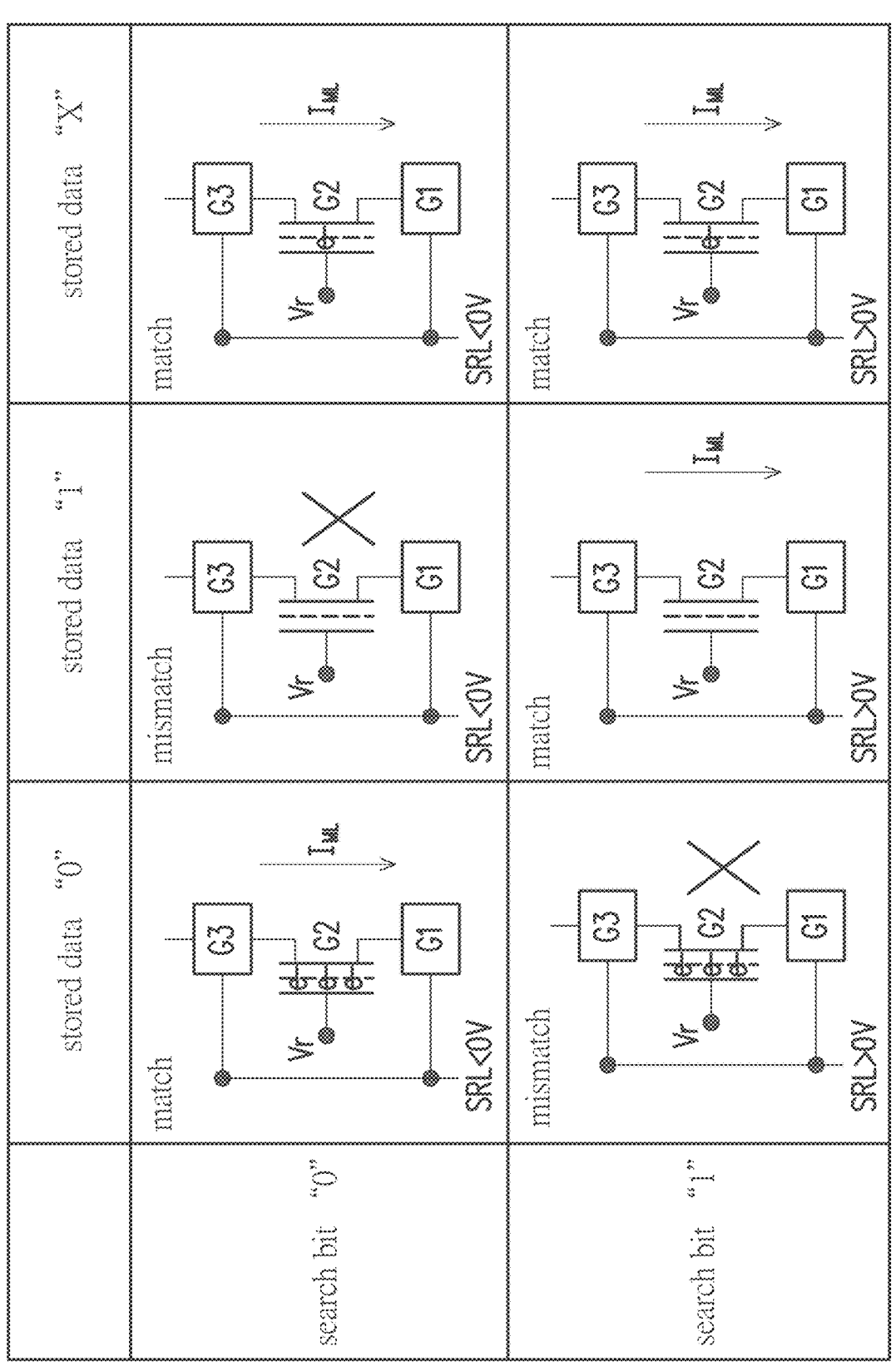
FIG. 12 is a truth table used in the NAND-type CAM array including the gate-controlled thyristor according to an embodiment of the disclosure.

FIG. 12 is a truth table used in the NAND-type CAM array including the gate-controlled thyristor according to an embodiment of the disclosure. In the NAND-type CAM array 300, memory cells of the same column are connected in series. Therefore, the truth table for the NAND type is different from the truth table for the NOR type. First of all, in the NAND type, a current is generated at the time of "match", and no current is generated at the time of "mismatch". Therefore, when the search bit is "0", if the data is "0", the search generates a result and is indicated as "match". At this time, the match line current $I_{ML}$ is generated. Alternatively, when the search bit is "1", if the data is "0", the search generates no result, and is indicated as "mismatch". At this time, the match line current $I_{ML}$ is 0.

In FIG. 12, there are three data states, where data "0" indicates that many electrons are injected into the ONO layer of the second transistor G2, data "1" indicates no electrons are injected into the ONO layer of the second transistor G2, and data "X" indicates that only a small amount of electrons are present in the ONO layer of the second transistor G2. In addition, the true table for the NAND type includes a state "don't care", i.e., data "X". In such state, the match line current $I_{ML}$ is generated, regardless of whether the search bit is "0" or "1".

In view of the foregoing, the gate-controlled thyristor according to the embodiments of the disclosure may serve as a TCAM cell, with which a NAND type or an NOR type CAM memory array can be formed. In addition, with the operation of the gate-controlled thyristor according to the embodiments of the disclosure, a high on/off current ratio is attained. Therefore, the sensing edge for reading is increased, and the accuracy in determining "match" or "mismatch" for data search is facilitated.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A gate-controlled thyristor, configured as a content-addressable memory cell and comprising:
a first transistor, having a control end, a first end, and a second end, wherein the control end is connected to a search line, and the second end is connected to a ground potential;
a second transistor, having a control end, a first end, and a second end, wherein the control end is connected to a fixed bias voltage, the second end is connected to the first end of the first transistor, and the second transistor is configured to store data; and
a third transistor, having a control end, a first end, and a second end, wherein the control end is connected to the search line, the first end is connected to a match line, and the second end is connected to the first end of the second transistor,
wherein a search bit is determined based on a search line voltage applied to the search line, and the search bit and the data are compared to determine whether the search bit matches the data,
wherein the first end of the third transistor connected to the match line is a P+ junction region, and the second end of the first transistor connected to the ground potential is a N+ junction region.

2. The gate-controlled thyristor as claimed in claim 1, wherein, in response to the search line voltage being higher than a predetermined voltage, the second transistor of the gate-controlled thyristor is in a first type operation state, and in response to the search line voltage being lower than the predetermined voltage, the second transistor of the gate-controlled thyristor is in a second type operation state.

3. The gate-controlled thyristor as claimed in claim 2, wherein the first type operation state is an NFET state, and the second type operation state is a PFET state.

4. The gate-controlled thyristor as claimed in claim 2, wherein the fixed bias voltage is set between a threshold voltage corresponding to a first data state under the second type operation state and a threshold voltage corresponding to a second data state under the first type operation state.

5. The gate-controlled thyristor as claimed in claim 2, wherein:

in response to the search line voltage being higher than the predetermined voltage, the search bit is a first bit, and
in response to the search line voltage being lower than the predetermined voltage, the search bit is a second bit.

6. The gate-controlled thyristor as claimed in claim 2, wherein:
in response to the search bit matching the data, the second transistor generates an off-current,
in response to the search bit mismatching the data, the second transistor generates an on-current, and
a ratio of the on-current relative to the off-current is at least 106.

7. The gate-controlled thyristor as claimed in claim 2, wherein the predetermined voltage is 0V.

8. The gate-controlled thyristor as claimed in claim 2, wherein the first type operation state is an N-type operation state, and the second type operation state is a P-type operation state.

9. The gate-controlled thyristor as claimed in claim 1, wherein the second transistor is provided with a charge trapping layer between the control end serving as a gate and a channel.

10. The gate-controlled thyristor as claimed in claim 9, wherein the charge capturing layer comprises an oxide-nitride-oxide layer.

11. A content-addressable memory array of an NOR type, the content-addressable memory array comprising:
a plurality of match lines, disposed to be substantially parallel in a column direction;
a plurality of search lines, disposed to be substantially parallel in a row direction; and
a plurality of content-addressable memory cells, each comprising a gate-controlled thyristor, wherein the content-addressable memory cells is respectively disposed at intersections of the match lines and the search lines,
wherein each of the gate-controlled thyristors comprises:
a first transistor, having a control end, a first end, and a second end, wherein the second end is connected to a ground potential;
a second transistor, having a control end, a first end, and a second end, wherein the control end is connected to a fixed bias voltage, the second end is connected to the first end of the first transistor, and the second transistor is configured to store data; and
a third transistor, having a control end, a first end, and a second end, wherein the second end is connected to the first end of the second transistor,
wherein the first end of the third transistor of each gate-controlled thyristor in a same row in the row direction, among the gate-controlled thyristors, is connected to a corresponding match line of the match lines,
wherein the first end of the third transistor connected to the match line is a P+ junction region, and the second end of the first transistor connected to the ground potential is a N+ junction region,
the control end of the first transistor and the control end of the third transistor of each gate-controlled thyristor in a same column of the column direction, among the gate-controlled thyristors, are connected to a corresponding search line of the search lines, and
for a selected gate-controlled thyristor among the gate-controlled thyristors, a search bit is determined based on a search line voltage applied to the corresponding search line, and the search bit and the data are compared to determine whether the search bit matches the data.

12. The content-addressable memory array as claimed in claim 11, wherein, in response to the search line voltage being higher than a predetermined voltage, the second transistor of the gate-controlled thyristor is in a first type operation state, and in response to the search line voltage being lower than the predetermined voltage, the second transistor of the gate-controlled thyristor is in a second type operation state.

13. The content-addressable memory array as claimed in claim 12, wherein the first type operation state is an NFET state, and the second type operation state is a PFET state.

14. The content-addressable memory array as claimed in claim 12, wherein the fixed bias voltage is set between a threshold voltage corresponding to a first data state under the second type operation state and a threshold voltage corresponding to a second data state under the first type operation state.

15. The content-addressable memory array as claimed in claim 12, wherein:
    in response to the search line voltage being higher than the predetermined voltage, the search bit is a first bit, and
    in response to the search line voltage being lower than the predetermined voltage, the search bit is a second bit.

16. The content-addressable memory array as claimed in claim 12, wherein:
    in response to the search bit matching the data, the second transistor generates an off-current,
    in response to the search bit mismatching the data, the second transistor generates an on-current, and
    a ratio of the on-current relative to the off-current is at least 106.

17. The content-addressable memory array as claimed in claim 12, wherein the predetermined voltage is 0V.

18. The content-addressable memory array as claimed in claim 12, wherein the first type operation state is an N-type operation state, and the second type operation state is a P-type operation state.

19. A content-addressable memory array of a NAND type, the content-addressable memory array comprising:
    a plurality of match lines;
    a plurality of search lines; and
    a plurality of content-addressable memory cells, each comprising a gate-controlled thyristor, wherein the content-addressable memory cells are arranged to extend along a column direction and a row direction to form a memory array,
    wherein each of the gate-controlled thyristors comprises:
    a first transistor, having a control end, a first end and a second end;
    a second transistor, having a control end, a first end, and a second end, wherein the control end is connected to a fixed bias voltage, the second end is connected to the first end of the first transistor, and the second transistor is configured to store data; and
    a third transistor, having a control end, a first end, and a second end, wherein the second end is connected to the first end of the second transistor,
    wherein the first end of the third transistor connected to the match line is a P+ junction region, and the second end of the first transistor connected to the ground potential is a N+ junction region, wherein a plurality of gate-controlled thyristors in a same column in the row direction, among the gate-controlled thyristors, are connected with each other in series, the first end of the third transistor of a first gate-controlled thyristor among the gate-controlled thyristors in the same column is connected to a corresponding match line of the plurality of match lines, and the second end of the first transistor of a final gate-controlled thyristor among the gate-controlled thyristors in the same column is connected to the ground potential,
    the control end of the first transistor and the control end of the third transistor of each of a plurality of gate-controlled thyristors in a same row in the column direction, among the gate-controlled thyristors, are connected to a corresponding search line of the plurality of search lines, and
    for a selected gate-controlled thyristor among the gate-controlled thyristors, a search bit is determined based on a search line voltage applied to the corresponding search line, and the search bit and the data are compared to determine whether the search bit matches the data.

20. The content-addressable memory array as claimed in claim 19, wherein, in response to the search line voltage being higher than a predetermined voltage, the second transistor of the gate-controlled thyristor is in a first type operation state, and in response to the search line voltage being lower than the predetermined voltage, the second transistor of the gate-controlled thyristor is in a second type operation state.

21. The content-addressable memory array as claimed in claim 20, wherein the first type operation state is an NFET state, and the second type operation state is a PFET state.

22. The content-addressable memory array as claimed in claim 20, wherein the fixed bias voltage is set between a threshold voltage corresponding to a first data state under the second type operation state and a threshold voltage corresponding to a second data state under the first type operation state.

23. The content-addressable memory array as claimed in claim 20, wherein:
    in response to the search line voltage being higher than the predetermined voltage, the search bit is a first bit, and
    in response to the search line voltage being lower than the predetermined voltage, the search bit is a second bit.

24. The content-addressable memory array as claimed in claim 20, wherein:
    in response to the search bit matching the data, the second transistor generates an off-current,
    in response to the search bit mismatching the data, the second transistor generates an on-current, and
    a ratio of the on-current relative to the off-current is at least 106.

25. The content-addressable memory array as claimed in claim 20, wherein the predetermined voltage is 0V.

26. The content-addressable memory array as claimed in claim 20, wherein the first type operation state is an N-type operation state, and the second type operation state is a P-type operation state.

* * * * *